(12) United States Patent
Yin et al.

(10) Patent No.: US 10,609,296 B1
(45) Date of Patent: Mar. 31, 2020

(54) ELECTRONIC DEVICE AND AUTOMATIC EXPOSURE CONVERGENCE METHOD

(71) Applicant: Guangzhou Tyrafos Semiconductor Technologies Co., LTD, Guangzhou (CN)

(72) Inventors: Ping-Hung Yin, Taipei (TW); Jia-Shyang Wang, Miaoli County (TW)

(73) Assignee: Guangzhou Tyrafos Semiconductior Technologies Co., LTD, Guangzhou (CN)

( * ) Notice: Subject to any disclaimer, the term of this patent is extended or adjusted under 35 U.S.C. 154(b) by 5 days.

(21) Appl. No.: 16/205,242

(22) Filed: Nov. 30, 2018

(30) Foreign Application Priority Data

Oct. 5, 2018 (TW) .............................. 107135206 A

(51) Int. Cl.
*H04N 5/235* (2006.01)
*H04N 5/353* (2011.01)
*H04N 5/355* (2011.01)
*G06K 9/00* (2006.01)

(52) U.S. Cl.
CPC ......... *H04N 5/2353* (2013.01); *H04N 5/2351* (2013.01); *H04N 5/3535* (2013.01); *H04N 5/35554* (2013.01); *G06K 9/00013* (2013.01)

(58) Field of Classification Search
CPC .... H04N 5/2353; H04N 5/2351; H04N 5/353; H04N 5/3535; H04N 5/35536; H04N 5/35545; H04N 5/35554
See application file for complete search history.

(56) References Cited

U.S. PATENT DOCUMENTS

| | | | | |
|---|---|---|---|---|
| 7,446,812 | B2* | 11/2008 | Ando | H04N 5/2355 348/297 |
| 10,142,563 | B2* | 11/2018 | Shionoya | H04N 5/343 |
| 2002/0190229 | A1* | 12/2002 | Nakamura | G06K 9/00013 250/556 |
| 2012/0218426 | A1* | 8/2012 | Kaizu | H04N 5/35554 348/208.4 |
| 2014/0286544 | A1* | 9/2014 | Yi | G06K 9/00013 382/124 |
| 2019/0103427 | A1* | 4/2019 | Matsumoto | H01L 27/14634 |

\* cited by examiner

*Primary Examiner* — Daniel M Pasiewicz
(74) *Attorney, Agent, or Firm* — JCIPRNET

(57) ABSTRACT

An electronic device and an automatic exposure convergence method are provided. The electronic device includes an image sensor and a processor. The image sensor is configured to obtain a first frame. The first frame includes a plurality of sub-frame regions, and each of the sub-frame regions includes a plurality of pixel data. The plurality of pixel data are obtained based on different exposure times. The processor is coupled to the image sensor. The processor is configured to analyze the first frame to combine the pixel data having the same exposure times in the sub-frame regions into a plurality of second frames. The processor analyzes the plurality of second frame to obtain a plurality of exposure values. The processor performs an exposure convergence operation based on the plurality of exposure values.

16 Claims, 5 Drawing Sheets

ELECTRONIC DEVICE AND AUTOMATIC EXPOSURE CONVERGENCE METHOD

CROSS-REFERENCE TO RELATED APPLICATION

This application claims the priority benefit of Taiwan application serial no. 107135206, filed on Oct. 5, 2018. The entirety of the above-mentioned patent application is hereby incorporated by reference herein and made a part of this specification.

BACKGROUND

Technical Field

The disclosure relates to an image sensing technology, and particularly relates to an electronic device and an automatic exposure convergence method.

Description of Related Art

With the evolution of image sensing technology, more and more electronic products are equipped with image sensing, for example, photo shooting or fingerprint sensing, and so on. However, during the image capturing process, the brightness of the ambient light received by the image sensor changes along with different environments or sensing objects. Therefore, a common image sensor performs an exposure convergence operation first in the image capturing process to obtain the best exposure value, and then obtains the corresponding frame based on the best exposure value. However, a traditional exposure convergence operation has to perform a plurality of image sensing operations by the image sensor based on different exposure times, and obtain a plurality of exposure values by analyzing a plurality of frames in sequence until the exposure values converge to the best exposure value. Therefore, the traditional exposure convergence operation takes more time and electricity of an electronic product. In light of the above, several solutions of the embodiment are provided below regarding how to quickly perform an exposure convergence operation.

SUMMARY

The disclosure provides an electronic device and an automatic exposure convergence method, which can quickly perform an exposure convergence operation.

The electronic device of the disclosure includes an image sensor and a processor. The image sensor is configured to obtain a first frame. The first frame includes a plurality of sub-frame regions, and each of the sub-frame regions includes a plurality of pixel data. The plurality of pixel data are obtained based on different exposure times. The processor is coupled to the image sensor. The processor is configured to analyze the first frame to combine the plurality of pixel data having the same exposure times in the sub-frame regions into a plurality of second frames. The processor analyzes the second frame to obtain a plurality of exposure values. The processor performs an exposure convergence operation based on the plurality of exposure values.

The automatic exposure convergence method of the disclosure includes the following steps. The first frame is obtained by the image sensor, wherein the first frame includes a plurality of sub-frame regions, and each of the sub-frame regions includes the plurality of pixel data, wherein each of the plurality of pixel data is obtained based on the plurality of different exposure times. The first frame is analyzed by the processor to combine the plurality of pixel data having the same exposure times in the plurality of sub-frame regions into the plurality of second frames. The exposure values are obtained by the processor analyzing the plurality of second frames. In addition, the exposure convergence operation is performed by the processor based on the plurality of exposure values.

In view of the foregoing, the electronic device and the automatic exposure convergence method of the disclosure obtains the first frame by the image sensor based on a plurality of different exposure times, and obtains the plurality of exposure values applied in the exposure convergence operation by analyzing the first frame, so that the processor may quickly perform the exposure convergence operation based on the exposure values.

To make the aforementioned more comprehensible, several exemplary embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EXEMPLARY EMBODIMENTS

Figure 1:
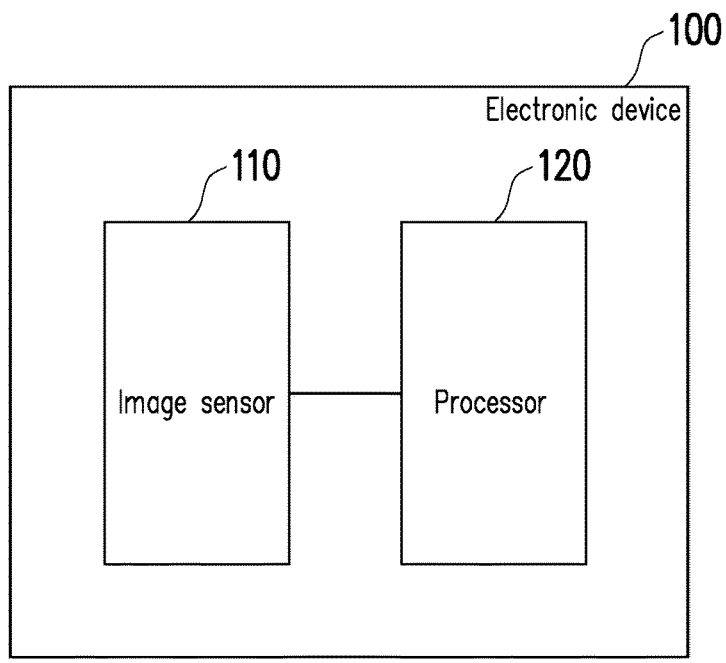
FIG. 1 is a schematic view of an electronic device according to an embodiment of the disclosure.

In order to make the disclosure more comprehensible, several embodiments are described below as examples of implementation of the disclosure. Moreover, elements/components/steps with the same reference numerals are used to represent identical or similar parts in the figures and embodiments where appropriate.

FIG. 1 is a schematic view of an electronic device according to an embodiment of the disclosure. Please refer to FIG. 1. An electronic device 100 includes an image sensor 110 and a processor 120. The processor 120 is coupled to the image sensor 110. The image sensor 110 is configured to obtain a first frame based on a plurality of different exposure times. The first frame may be divided into a plurality of sub-frame regions, and each of the sub-frame regions includes a plurality of pixel data of the first frame respectively obtained based on the plurality of different exposure times. In this embodiment, the processor 120 analyzes the first frame to obtain a plurality of exposure values, and performs an exposure convergence operation based on the exposure values.

In this embodiment, the electronic device 100 may be a portable electronic product, for example, a mobile phone, a tablet, or laptop, etc. However, the disclosure is not limited thereto. In this embodiment, the image sensor 110 may be a COMS image sensor (CIS) or a charge coupled device (CCD). In this embodiment, the processor 120 may be an image signal processor (ISP), a central processing unit (CPU), a microprocessor, a digital signal processor (DSP), a programmable logic controller (PLC), an application specific integrated circuit (ASIC), a system on chip (SoC) or other similar element or the combination of the aforementioned elements. In addition, in this embodiment, the electronic device 100 may further include memory. The memory may be configured to store the frame, the data, image analyzing software, the computing software, and the like mentioned in each of the embodiments of the disclosure. However, the disclosure is not limited thereto.

In one embodiment, the electronic device 100 may be a portable electronic product having a function of under-display optical fingerprint, and the image sensor 110 may be a fingerprint sensor. In this regard, the electronic device 100 may be used to perform fingerprint sensing. Also, before obtaining a fingerprint image, the electronic device 100 may automatically perform the exposure convergence by sensing the current situation of the fingerprint to obtain the best exposure value, and obtain the corresponding fingerprint image based on the best exposure value.

Figure 2:
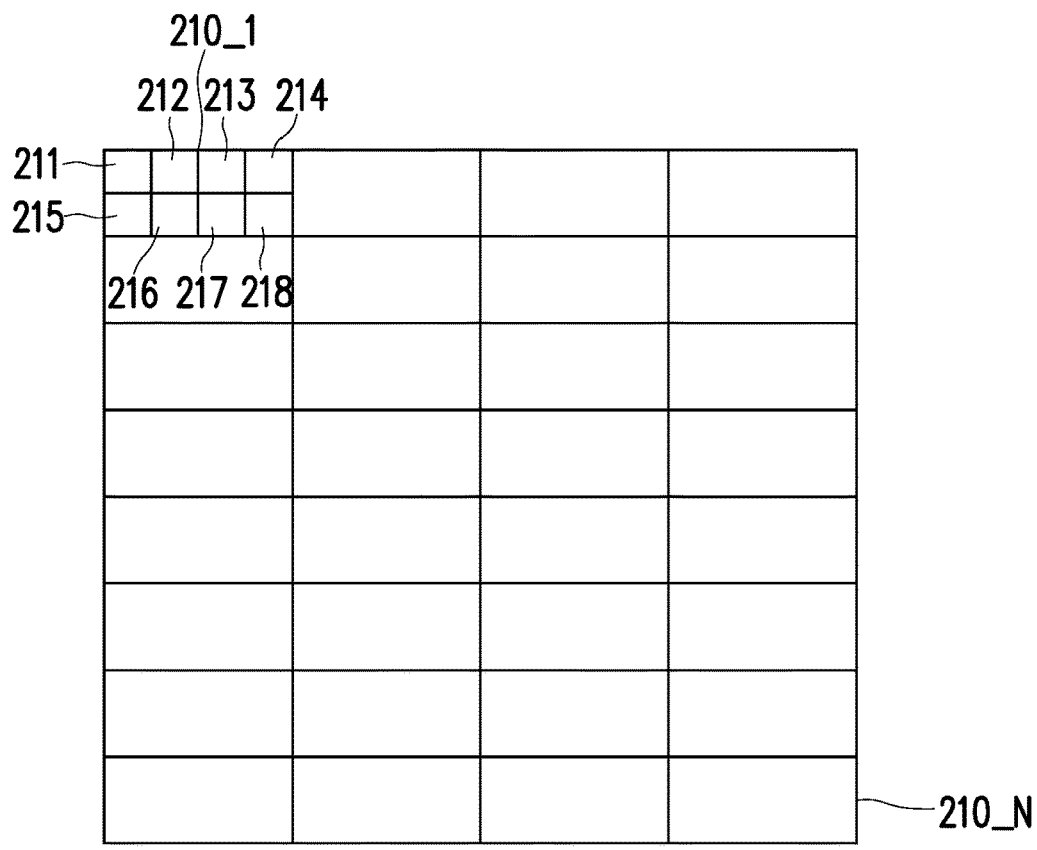
FIG. 2 is a schematic view of a first frame according to an embodiment of the disclosure.
Figure 3A:
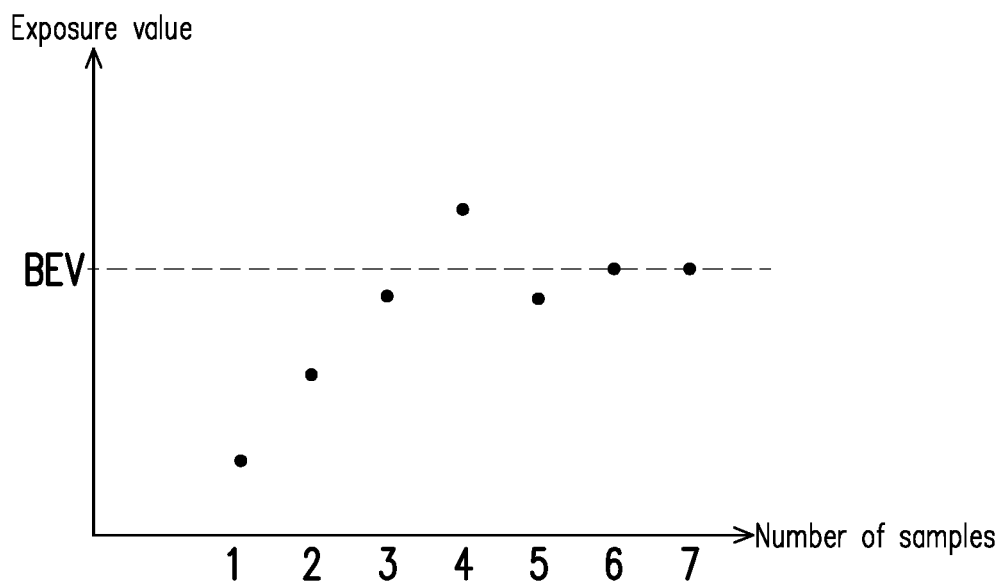
FIG. 3A is a schematic view of a current exposure convergence.
Figure 3B:
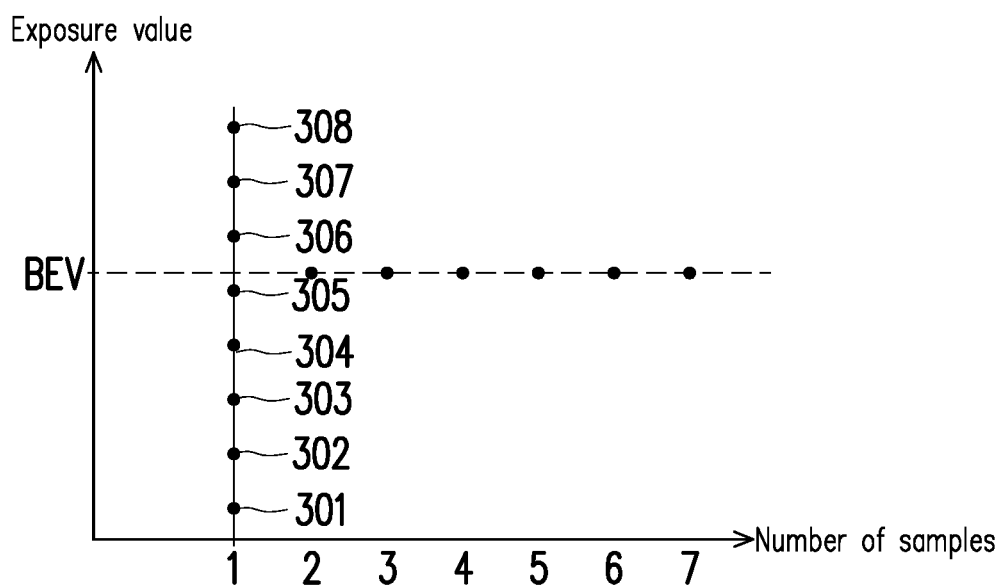
FIG. 3B is a schematic view of an exposure convergence according to an embodiment of the disclosure.

FIG. 2 is a schematic view of a first frame according to an embodiment of the disclosure. FIG. 3A is a schematic view of a current exposure convergence. FIG. 3B is a schematic view of an exposure convergence according to an embodiment of the disclosure. Please refer to FIG. 1 to FIG. 3B. The image sensor 110 may further include a plurality of pixel units, and the plurality of pixel units may be divided into a plurality of pixel groups. In this embodiment, the pixel groups of the image sensor 110 are configured to obtain a first frame as illustrated in FIG. 2 based on different exposure times in an image capturing operation. As shown in FIG. 2, the first frame includes a plurality of sub-frame regions 210_1-210_N, wherein N is an integer greater than 0. Each of the plurality of sub-frame regions 210_1-210_N includes eight pixel data 211-218, and the plurality of pixel data 211-218 are obtained based on the plurality of different exposure times, respectively. However, the amount of the pixel data of the disclosure is not limited to that shown in FIG. 2. In this embodiment, the processor 120 may analyze the first frame to combine the pixel data 211-218 having the same exposure times in the sub-frame regions 210_1-210_N into a plurality of second frames. Then, the processor analyzes the plurality of second frames to obtain a plurality of exposure values 301-308 as illustrated in FIG. 3.

Specifically, in the beginning, during the process when the electronic device 100 of the embodiment performs an automatic exposure convergence operation, the processor 120 calculates a highest luminance and a lowest luminance of the plurality of exposure times based on a highest luminance and a lowest luminance that a current image sensing environment may encounter. In addition, the processor 120 may determine the plurality of exposure times based on the longest exposure time and the shortest exposure time. For example, six exposure times are selected between the longest exposure time and the shortest exposure time based on a fixed time interval to obtain a total of eight exposure time parameters. In other words, the electronic device 100 of the embodiment may adaptively obtain the exposure time. Then, the electronic device 100 may obtain the first frame by the image sensor 110 using different exposure times, and further combine the plurality of pixel data having the same exposure times in the first frame into the plurality of second frames. Hence, a resolution of the second frame is lower than that of the first frame. The processor 120 of the embodiment analyzes the second frames to obtain the corresponding exposure values 301-308. That is, the electronic device 100 of the embodiment obtains the exposure values 301-308 in a single image capturing operation without obtaining the values through 8 image capturing operations. After that, as shown in FIG. 3B, the processor 120 analyzes the exposure values 301-308 to obtain the next sampled exposure values. Since the exposure values 301-308 includes sufficient information, the second sampled exposure value may be converged to the best exposure value (BEV). Therefore, the electronic device 100 of this embodiment may quickly perform the exposure convergence operation.

For example, the image sensor 110 of the embodiment may be a fingerprint sensor. When the electronic device 100 performs a fingerprint operation, specific exposure values may be required as the ambient light sensed by the image sensor 110 may differ along with the environmental status of the electronic device 100, or the image sensed by the image sensor 110 may vary with different finger characteristic or usage habits. Accordingly, before the electronic device 100 of this embodiment performs the fingerprint operation, the automatic exposure convergence operation may be performed first to obtain the BEV. Afterwards, the electronic device 100 may obtain related exposure parameters based on the BEV, and correspondingly obtain fingerprints having better image quality.

Figure 4:
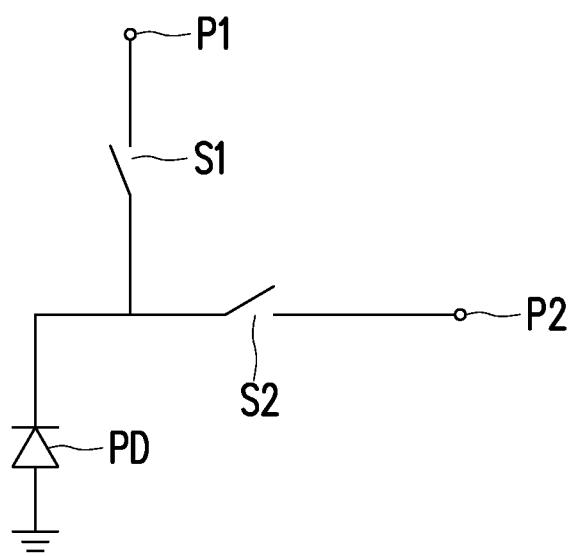
FIG. 4 is a schematic view of a pixel unit according to an embodiment of the disclosure.

FIG. 4 is a schematic view of a pixel unit according to an embodiment of the disclosure. Please refer to FIG. 4. The equivalent circuit of the pixel unit mentioned in the above embodiments may be shown as FIG. 4. However, the disclosure is not limited thereto. In this embodiment, a pixel unit 400 may include a photosensitive diode PD, a first switch S1, and a reset switch S2. An end of the photosensitive diode PD is coupled to the first switch S1 and the reset switch S2. An end of the first switch S1 is coupled to a first point P1, wherein the first point P1 may be coupled to an ADC. An output end of the ADC may be coupled to the aforementioned processor or a backend image signal processing unit (e.g. a decoder). A first end of the second switch S2 is coupled to a second end P2, and the second end P2 may be coupled to a discharge path. Specifically, in a frame time, the photosensitive diode PD correspondingly generates a photosensitive charge based on a photosensitive result, and the pixel unit 400 receives the reset signal first by the reset switch to discharge. Afterwards, the pixel unit 400 receives a read-out signal by the first switch S1 to output the photosensitive charge accumulated in the photosensitive diode PD to the ADC. The ADC outputs the information to the processor or the backend image processing unit to obtain the corresponding pixel data. Furthermore, the aforementioned reset signal and the read-out signal may be, for example, a pulse signal.

Figure 5:
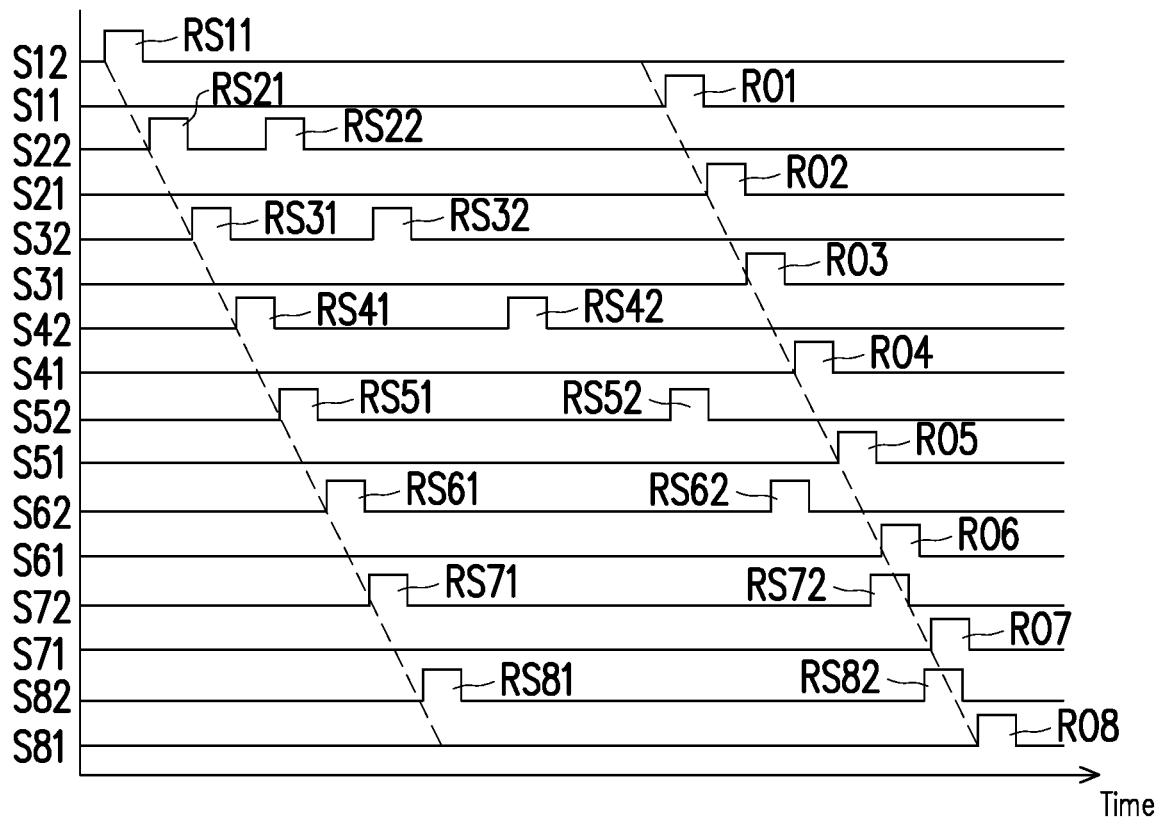
FIG. 5 is a sequence diagram of operating a plurality of pixel units according to an embodiment of the disclosure.

FIG. 5 is a sequence diagram of operating a plurality of pixel units according to an embodiment of the disclosure. Please refer to FIG. 1, FIG. 2, and FIG. 5. Take FIG. 2 as an example. The image sensor 110 may include 8 pixel units. For example, the pixel data of 211 in each of the sub-frame regions 210_1-210_N of the first frame may be obtained based on a reset signal RS11 and a read-out signal RO1. The pixel data of 212 in each of the sub-frame regions 210_1-210_N of the first frame may be obtained based on a reset signal RS11 and a read-out signal RO1, and so on. The pixel data of 218 in each of the sub-frame regions 210_1-210_N of the first frame may be obtained by a first switch S81 of the eighth pixel unit and a reset switch S82 based on reset signals RS81, RS82 and a read-out signal RO1.

It should be noted that a first-time difference is provided between each of the reset signals RS11-RS81 and the read-out signals RO1-RO8. The first-time difference is a start integration time and an end integration time of the pixel (equivalent to the exposure time). In this embodiment, at least part of the reset switches S21-S81 of the pixel units of the image sensor 110 further receives the reset signals RS22-RS82, and each of the sequence of the reset signals inserts between the reset signals RS21-RS81 and the read-out signals RO1-RO8. The reset signals RS22-RS82 are configured to shorten integration time. In other words, take the second pixel unit as an example. Since the reset switch S22 of the second pixel unit receives reset signals RS21 and RS22 for two times, when the first switch S21 of the second pixel unit receives the read-out signal RO2, the pixel data provided by the second pixel unit are determined by the photosensitive charge provided (or cumulated) by the photosensitive diode in the second-time difference between the reset signal RS22 to the read-out signal RO2. Therefore, since the reset signals RS11, RS22-RS82 have different time differences from the readout signals RO1-RO8, respectively, the pixel units of the image sensor 110 of the embodiment may obtain the pixel data 211-218 of each of the sub-frame regions 210_1-210_N of the first frame based on different integration times (or exposure times), respectively.

Besides, in one embodiment, the reset switches S11-S81 of the pixel units of the image sensor 110 may merely receive the reset signals RS11, RS22-RS82, without receiving the reset signals RS21-RS81. In addition, in another embodiment, the reset signals RS11, RS22-RS82 may have the same time differences as read-out signals RO1-RO8, respectively.

Figure 6:
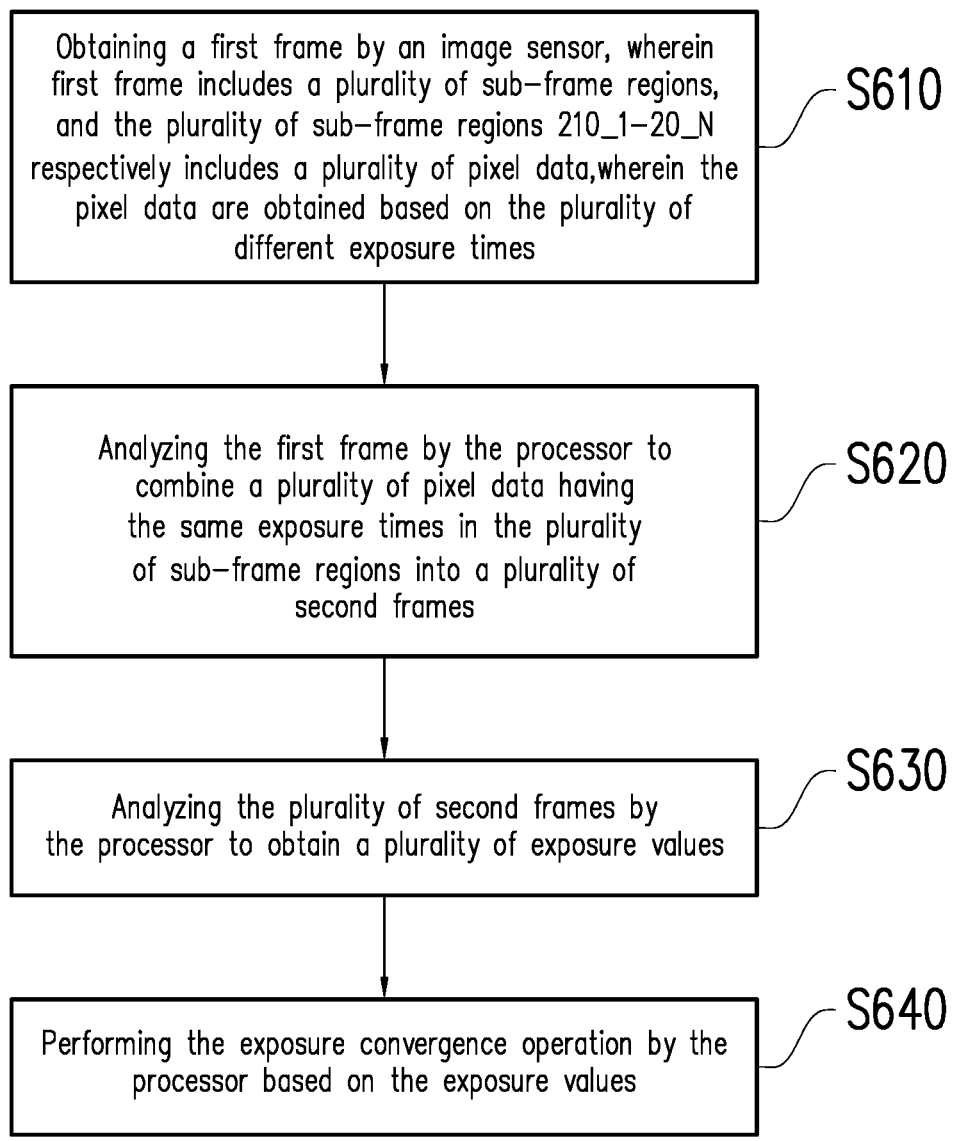
FIG. 6 is a flow chart of an automatic exposure convergence method according to an embodiment of the disclosure.

FIG. 6 is a flow chart of an automatic exposure convergence method according to an embodiment of the disclosure. Please refer to FIG. 1, FIG. 2, and FIG. 6. The automatic exposure convergence method of this embodiment may at least be applied to the embodiment of the electronic device 100 of FIG. 1. The electronic device 100 includes the image sensor 110 and the processor 120. That is, the electronic device 100 may perform the following steps S610-S640 to realize the automatic exposure convergence operation. In step S610, the image sensor 110 obtains the first frame, wherein the first frame includes a plurality of sub-frame regions 210_1-20_N, and each of the sub-frame regions 210_1-20_N includes the plurality of pixel data 211-218, wherein the pixel data 211-218 are obtained based on the plurality of different exposure times, respectively. In step S620, the processor 120 analyzes the first frame to combine plurality of pixel data having the same exposure times in the sub-frame regions 210_1-20_N into a plurality of the second frames. In step S630, the processor 120 analyzes the plurality of second frames to obtain a plurality of exposure values. In step S640, the processor 120 performs the exposure convergence operation based on the exposure values. Therefore, the electronic device of the embodiment may quickly perform the exposure convergence operation.

Moreover, regarding features or other implementing details of other elements of the electronic device 100 of the embodiment, please refer to the explanations of the aforementioned embodiments of FIG. 1 to FIG. 5 to acquire enough teachings, suggestions, and implementation instructions, and shall not be repeated here.

In summary of the above, the electronic device and automatic exposure convergence method of the disclosure may obtain the first frame in a single image capturing operation by the image sensor based on the plurality of different exposure times, and obtain the plurality of exposure values used in the exposure convergence operation by analyzing the first frame. In other words, the processor of the electronic device may quickly perform the exposure convergence operation in the single image capturing operation based on the exposure values to effectively save the number of operations and time of image capture performed by the image sensor in the exposure convergence operation, and thus effectively saves the electricity of the electronic device.

Although the disclosure is disclosed as the embodiments above, the embodiments are not meant to limit the disclosure. Any person skilled in the art may make slight modifications and variations without departing from the spirit and scope of the disclosure. Therefore, the protection scope of the disclosure shall be defined by the claims attached below.

What is claimed is:

1. An electronic device, comprising:
   an image sensor, configured to obtain a first frame, wherein the first frame comprises a plurality of sub-frame regions, and each of the plurality of sub-frame regions comprises a plurality of pixel data, wherein the plurality of pixel data are obtained based on a plurality of different exposure times; and
   a processor, coupled to the image sensor, configured to analyze the first frame to combine the plurality of pixel data having the same exposure times in the plurality of sub-frame regions into a plurality of second frames, and analyze the plurality of second frames to obtain a plurality of exposure values,
   wherein the processor performs an exposure convergence operation based on the plurality of exposure values.

2. The electronic device according to claim 1, wherein the processor calculates a highest luminance and a lowest luminance of the plurality of exposure times based on a highest luminance and a lowest luminance that a current image sensing environment may encounter, and the processor determines the plurality of exposure times based on the longest exposure time and the shortest exposure time.

3. The electronic device according to claim 1, wherein the image sensor comprises a plurality of pixel units, and the plurality of pixel units may be divided into a plurality of pixel groups, wherein the plurality of pixel groups are configured to obtain the plurality of pixel data of the first frame based on different exposure times in a single image capturing operation.

4. The electronic device according to claim 3, wherein each of the plurality of pixel units comprises:
   a photosensitive diode;
   a first switch, coupled to the photosensitive diode; and
   a reset switch, coupled to the photosensitive diode, wherein the reset switch is configured to receive a first reset signal, and the first switch is configured to receive a read-out signal,
   wherein a first-time difference between the first reset signal and the read-out signal is an exposure time.

5. The electronic device according to claim 4, wherein the plurality of pixel units of the different pixel groups have the same first-time difference.

6. The electronic device according to claim 4, wherein at least part of the reset switch of the pixel units further receives a second reset signal, and a sequence of the second reset signal is between the first reset signal and the read-out signal.

7. The electronic device according to claim 6, wherein a second time difference is provided between each of the second reset signal and the read-out signal of the pixel units, and the second time difference is the exposure time.

8. The electronic device according to claim 1, wherein the image sensor is a fingerprint sensor.

9. An automatic exposure convergence method, comprising:
    acquiring a first frame by an image sensor, wherein the first frame comprises a plurality of sub-frame regions, and each of the plurality of sub-frame regions comprises a plurality of pixel data, wherein each of the plurality of pixel data are obtained based on a plurality of different exposure times;
    analyzing the first frame by a processor to combine the plurality of pixel data having the same exposure times in the plurality of sub-frame regions into a plurality of second frames;
    analyzing the plurality of second frames by the processor to obtain a plurality of exposure values; and
    executing an exposure convergence operation by the processor based on the plurality of exposure values.

10. The automatic exposure convergence method according to claim 9, further comprising:
    calculating a longest exposure time and a shortest exposure time of the plurality of exposure times by the processor based on a highest luminance and a lowest luminance that a current image sensing environment may encounter; and
    determining the plurality of exposure times by the processor based on the longest exposure time and the shortest exposure time.

11. The automatic exposure convergence method according to claim 9, wherein the image sensor comprises a plurality of pixel units, and the plurality of pixel units may be divided into a plurality of pixel groups, wherein the step of obtaining the first frame by the image sensor comprises:
    obtaining the plurality of pixel data of the first frame by the plurality of pixel groups in an image capturing operation based on different exposure times.

12. The automatic exposure convergence method according to claim 11, wherein each of the plurality of pixel units comprises a photosensitive diode, a first switch and a reset switch, and the steps of obtaining the first frame by the image sensor comprise operating the pixel units to perform:
    receiving a first reset signal by the reset switch; and
    receiving a read-out signal by the first switch, wherein a first-time difference between the first reset signal and the read-out signal is an exposure time.

13. The automatic exposure convergence method according to claim 12, wherein the plurality of pixel units of different pixel groups have the same first-time difference.

14. The automatic exposure convergence method according to claim 12, wherein the steps of obtaining the first frame by the image sensor further comprise:
    further receiving a second reset signal by at least part of the reset signal of the plurality of pixel units, wherein a sequence of the second reset signal is between the first reset signal and the read-out signal.

15. The automatic exposure convergence method according to claim 14, wherein a second-time difference is provided between each of the second reset signals of the plurality of pixel units and the read-out signal, and the second-time difference is the exposure time.

16. The automatic exposure convergence method according to claim 9, wherein the image sensor is a fingerprint sensor.

* * * * *